United States Patent [19]
Kuo et al.

[11] Patent Number: 5,869,219
[45] Date of Patent: Feb. 9, 1999

[54] METHOD FOR DEPOSITING A POLYIMIDE FILM

[75] Inventors: Chen-Cheng Kuo; Ho-Ku Lan, both of Hsin-Chu; Hung-Chih Chen; Shih-Shiung Chen, both of Shin-Chu, all of Taiwan

[73] Assignee: Taiwan Semiconductor Manufacturing Co. Ltd., Hsin-Chu, Taiwan

[21] Appl. No.: 964,899

[22] Filed: Nov. 5, 1997

[51] Int. Cl.[6] .............................. G03C 1/492; B05D 5/12
[52] U.S. Cl. ...................... 430/270.1; 430/311; 430/935; 427/58; 438/909
[58] Field of Search ...................................... 430/311, 330, 430/935, 270.1; 427/314, 541, 58; 438/909

[56] References Cited

U.S. PATENT DOCUMENTS

| | | | |
|---|---|---|---|
| 5,180,691 | 1/1993 | Adachi et al. | 437/235 |
| 5,270,079 | 12/1993 | Bok | 427/429 |

*Primary Examiner*—Janet Baxter
*Assistant Examiner*—Rosemary Ashton
*Attorney, Agent, or Firm*—Tung & Associates

[57] ABSTRACT

The present invention discloses a method for coating a polyimide precursor on an electronic structure incorporating the use of a silicon coupling agent without any bubble defect in the film deposited. The method can be carried out by flowing at least one inert gas through a deposition chamber and thereby keeping the relative humidity in the chamber at below 25% to carry away the formation of any water molecules and water vapor to prevent the formation of bubbles in the film deposited.

14 Claims, 1 Drawing Sheet

METHOD FOR DEPOSITING A POLYIMIDE FILM

FIELD OF THE INVENTION

The present invention generally relates to a method for depositing a polyimide precursor on an electronic structure incorporating the use of a silicon coupling agent and more particularly, relates to a method for coating a polyimide precursor on a semiconductor wafer incorporating the use of a silicon coupling agent without an air bubble defect by continuously purging through a deposition chamber with an inert gas during the deposition process.

BACKGROUND OF THE INVENTION

In the fabrication of modern semiconductor devices, the technology used for packaging a ULSI chip after the completion of the fabrication processes has become more important. The packaging of a ULSI chip is important because the package must provide electrical connection to the chip, expand the chip electrode pitch for the next level of packaging, protect the chip from mechanical and environmental stress, and provide a proper heat sink to dissipate heat generated by the chip. The more advanced and more densely-packed ULSI devices require superior package performance due to their reduced package size and the resulting increased density. In some of the logic and microprocessor devices, the higher input/output terminal numbers, the higher speed and the higher power dissipation further create additional requirements for the packaging technology. An ideal packaging technology must be able to accomplish, simultaneously, larger input/output pin counts, improved heat conductance and superior electrical performance in a smaller package than was ever achieved before.

Prior to the packaging of a semiconductor device, the device is processed through back-end processing steps such as the deposition and patterning of a metal conductive layer and the coating of a silicon nitride protective layer for moisture barrier before the device can be encapsulated in one of two popular packaging techniques, i.e., a hermetic-ceramic package or a plastic package. In a hermetic-ceramic package, the chip is sealed in an environment such that it is decoupled from the external environment by a vacuum-tight enclosure. The package is usually ceramic-based and designed for high performance applications at a high cost basis. On the other hand, a chip is not perfectly decoupled from the external environment in a plastic package since it is encapsulated with a plastic material, i.e., typically an epoxy-based resin or a polyvinyl chloride. The plastic packaging technique has become more prevalent in recent years due to their easy processing and low cost. The packaging process by plastic can be automated and therefore can be carried out at a low cost.

In a typical plastic package, a chip is attached to a paddle formed in a lead frame that is made of an etched or stamped thin sheet of metal. The lead frame serves as a support around which the package is molded, and furthermore, it provides external leads in the completed package. Interconnections to the chip can be made by fine metal wire such as gold. The packaging process of encapsulation can be carried out by a transfer molding technique utilizing an epoxy resin or a PVC. The plastic resin covers the chip and forms the outer profile of the package at the same time. The external leads are then formed into their final shape after the molding process.

In the plastic molding process, a thermoset molding material such as epoxy or a thermoplastic molding material such as PVC is normally molded in large multi-cavity molds. After a molding compound enters a tool, usually pre-heated, it melts under pressure and heat, and then flows to fill the mold cavities which contain lead frame strips with their attached chips. The lead frame is normally equipped with long, fragile fingers and the chip is interconnected to these thin leads with thin gold wires of 25 $\mu$m diameter. In order to avoid damaging to the fragile structure, the viscosity and the velocity of the molding compound must be precisely controlled within a desirable range. Commercially available molding compounds are designed to meet the processing requirements and can be processed at a temperature of about 175° C. and at a pressure of about 6 MPa.

After a semiconductor device having a silicon nitride protective layer deposited on top is encapsulated by a plastic material, a molding stress exists between the silicon nitride layer and the encapsulating plastic layer. The stress is normally caused by the large difference in their coefficients of thermal expansion. After the semiconductor device is cooled to room temperature, the high molding stress existed in the plastic package may then cause the silicon nitride layer to crack and thus produce quality problems. To prevent this from happening, a new technique that involves the placement of a buffer coating layer on top of the silicon nitride layer prior to the plastic encapsulation process has been proposed. The buffer coating layer applied on top of the silicon nitride layer is normally of a polymeric base and acts as a lubricating layer to relieve the molding stress between the nitride and the molding compound. One of such suitable buffer coating layer is formed of a polyimide material.

Polyimides are normally derived from imidization reactions between amines and organic acids which occur in a temperature range between 130° C. and 200° C. Polyimides can be applied by a technique similar to that used for applying spin-on-glass materials, i.e., by spinning and curing on a wafer surface such that a planar surface is obtained for use as multi-level metalization and as a buffer layer. Polyimide is widely used in semiconductor processing due to its desirable properties such as ease of deposition, flexibility in composition, planarity as a spun film, good temperature tolerance, excellent weathering and mechanical wear properties, low pinhole density, and low dielectric constant. Most frequent uses for polyimide films in semiconductor processing are interlevel dielectrics and protective buffer coats. Similar to a photoresist material, polyimide can be made photo-sensitive by the addition of a photoactive compound. A photo-sensitive polyimide can therefore be used as a mask for opening bond pads and fuse windows on the surface of a semiconductor device by an etch-back process. When polyimide is used as a protective buffer coat, in a thickness range between about 5 $\mu$m and about 80 $\mu$m, the polyimide film reduces molding stress and furthermore, serves to block ionizing radiation such as alpha particles from reaching silicon.

A typical polyimide coating process is shown in FIG. 1. The polyimide coating process 10 can be started by a wafer loading step 12 during which a semiconductor wafer is first positioned in a backing chamber. The wafer is then processed in a pre-baked step 14 during which a series of pre-baking steps are carried out at a temperature of approximately 250° C. The purpose of the pre-baking step 14 is to dry the wafer and reduce its moisture content on the wafer surface. After the wafer is cooled to approximately room temperature, a polyimide coating is applied to the wafer surface in step 16 while the wafer is being spun at a suitable rotational speed. The polyimide coated wafer is then post-baked in a series of oven exposures wherein the baking temperature is raised from 80° C. to 95° C. The total post-baking time required is approximately 5 minutes. This is shown as step 18 in FIG. 1. After the execution of the post-baking step 18, the wafer is again cooled to room temperature and then exposed in an imaging step 20 to produce a pattern on a semiconductor device for producing the necessary features such as bond pads and fuse windows. The polyimide film patterned on the wafer surface is then sent through a developing step 22 for developing the exposed features. After a developing and rinsing process is carried out, the wafer is unloaded at the last step 24.

During a conventional polyimide coating process 10 as that shown in FIG. 1, a silicon coupling agent is frequently used as an adhesion promoting layer on top of the semiconductor wafer prior to the coating of the polyimide layer. A typical silicon coupling agent has a formula of:

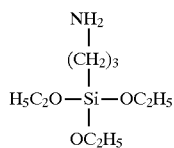

The silicon coupling agent is highly reactive with water and water is normally contained in the NMP (N-methylpyrrolidone) solvent. It has been found that 1% of water is normally contained in NMP. A dispersive intermediate compound which is formed between the coupling agent and water can further react with a silicon substrate to provide a desirable ionic-bonded structure to assist the adhesion. This is shown by the following equation:

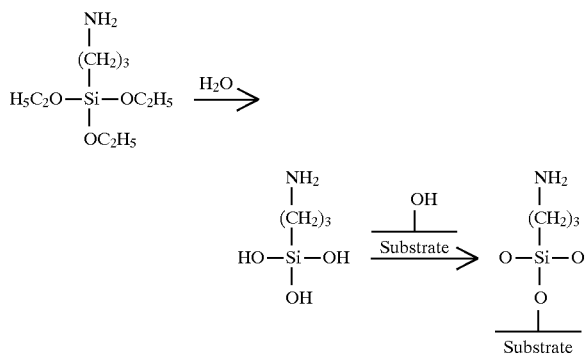

However, when a coated polyimide precursor is exposed to ambient moisture for more than 15 minutes, the dispersed intermediate compound polymerizes itself and forms a polymer and water molecules. The water molecules are presented as water vapor at the polyimide deposition temperature and as a result, form bubbles between the polyimide film and the substrate it covers. The bubble formation presents a serious quality problem in a semiconductor device that is coated with a polyimide film.

It is therefore an object of the present invention to provide a method for depositing a polyimide film on an electronic structure that does not have the drawbacks and shortcomings of the conventional deposition method.

It is another object of the present invention to provide a method for depositing a polyimide film on an electronic structure incorporating the use of a silicon coupling agent that does not form bubble defect from water molecules generated by the silicon coupling agent.

It is a further object of the present invention to provide a method for coating a polyimide precursor containing a silicon coupling agent on a semiconductor wafer that does not produce bubble defect in the polyimide film due to a polymerization reaction of the silicon coupling agent.

It is another further object of the present invention to provide a method for coating a polyimide film on a semiconductor wafer when a silicon coupling agent is utilized by providing an improved environment of low humidity for the coating process.

It is still another object of the present invention to provide a method for coating a polyimide film on a semiconductor wafer when a silicon coupling agent is used by purging through the deposition chamber with an inert gas prior to and during the polyimide deposition process.

It is yet another object of the present invention to provide a method for depositing a polyimide film on a semiconductor wafer when a silicon coupling agent is used for adhesion promotion without bubble defect that can be carried out by purging an inert gas through the deposition chamber at a flow rate of not less than 0.5 liter/min.

It is still another further object of the present invention to provide a method for depositing a polyimide film on a semiconductor wafer by first providing a polyimide precursor containing a polyimide, a silicon coupling agent, a photo-active compound and a solvent and then depositing the precursor on the wafer surface in an environment that was purged with an inert gas.

It is yet another further object of the present invention to provide a method for depositing a polyimide film on a semiconductor wafer wherein a silicon coupling agent is used by carrying out the deposition process in a chamber that has a relative humidity of not higher than 25 %.

SUMMARY OF THE INVENTION

In accordance with the present invention, a method for depositing a polyimide film on a semiconductor wafer by utilizing a polyimide precursor containing a polyimide, a silicon coupling agent, a photo-active compound and a solvent without the bubble defect is provided.

In a preferred embodiment, a method for coating a polyimide precursor on an electronic structure incorporating the use of a silicon coupling agent and without the bubble defect can be carried out by the operating steps of first providing a deposition chamber having an electronic structure positioned therein, then flowing at least one inert gas through the chamber, and then depositing a polyimide precursor containing a silicon coupling agent on a top surface of the electronic structure.

In another preferred embodiment, a method for forming a photo-sensitive polyimide film on a semiconductor wafer can be carried out by the steps of first positioning a semiconductor wafer in a deposition chamber, flowing at least one inert gas through the chamber at a flow rate sufficient to maintain a relative humidity in the chamber at less than about 25%, and then depositing a photo-sensitive polyimide precursor containing a moisture-sensitive coupling agent therein on a top surface of the semiconductor wafer. The moisture-sensitive coupling agent utilized is a silicon-based coupling agent, while the inert gas utilized is normally of Ar, He or $N_2$. The minimum flow rate for the at least one inert gas is about of 0.5 liter/min.

The present invention is further directed to a semiconductor structure that has a polyimide buffer layer deposited on top without any bubble defect which includes a pre-processed semiconductor substrate, and a photo-sensitive polyimide layer on top of the substrate capable of being patterned to expose bond pads or fuse windows on the substrate and is substantially without bubble defect.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a novel method for depositing a polyimide layer on an electronic structure incorporating the use of a silicon coupling agent without the defect of any bubble formation by continuously purging through the deposition chamber with at least one inert gas selected from Ar, He and $N_2$. The flow rate of the inert gas through the deposition chamber should be at least 0.5 liter/min, and preferably at least 1 liter/min. It is desirable that the relative humidity in the deposition chamber to be kept under 25% during the polyimide deposition process.

It has been found that, when a polyimide layer is deposited on top of a semiconductor device, i.e., on top of a metal conducting layer and a silicon nitride protective layer, the polyimide layer functions efficiently as a buffer coating (or a lubricating layer) to alleviate the molding stress that would otherwise exist between the silicon nitride barrier layer and the molded plastic material. A potential cracking problem for the silicon nitride layer caused by such residual molding stress can thus be avoided.

It is known that a silicon coupling agent such as:

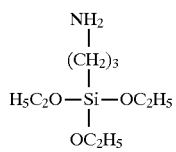

can be utilized to promote adhesion between a polyimide layer and a silicon nitride surface. A desirable reaction of the silicon coupling agent for promoting adhesion between polyimide and silicon nitride can be expressed by the following equation:

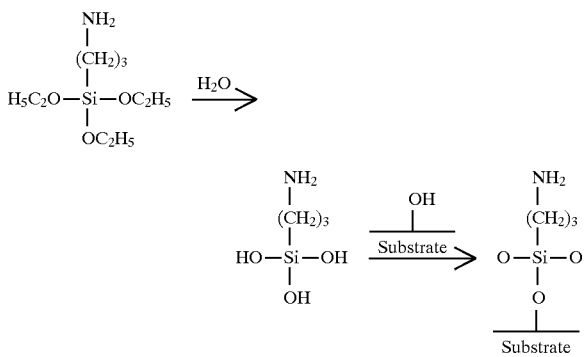

It is seen from the equation that, due to the approximately 1% of water normally contained in the solvent of NMP (N-methyl-pyrrolidone), an ionic bond with a silicon surface is produced which assists in the adhesion between a polyimide coating and a silicon nitride layer.

However, when a polyimide coating is exposed to ambient moisture (i. e, at larger than 25% relative humidity) for more than 15 minutes, the following reaction occurs:

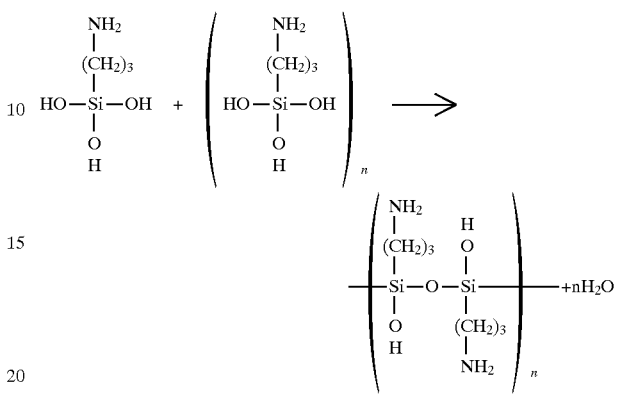

As the equation indicates water molecules are produced by the reaction and exist as water vapor at the elevated temperature used for the polyimide deposition process. The dispersive intermediate polymerizes and as a result, produces water molecules and water vapor that appear as bubbles in the polyimide film formed.

The present invention novel method therefore, is capable of eliminating the water molecule, i.e., the water vapor formation and thus the bubble formation in the polyimide film deposited.

Figure 1:
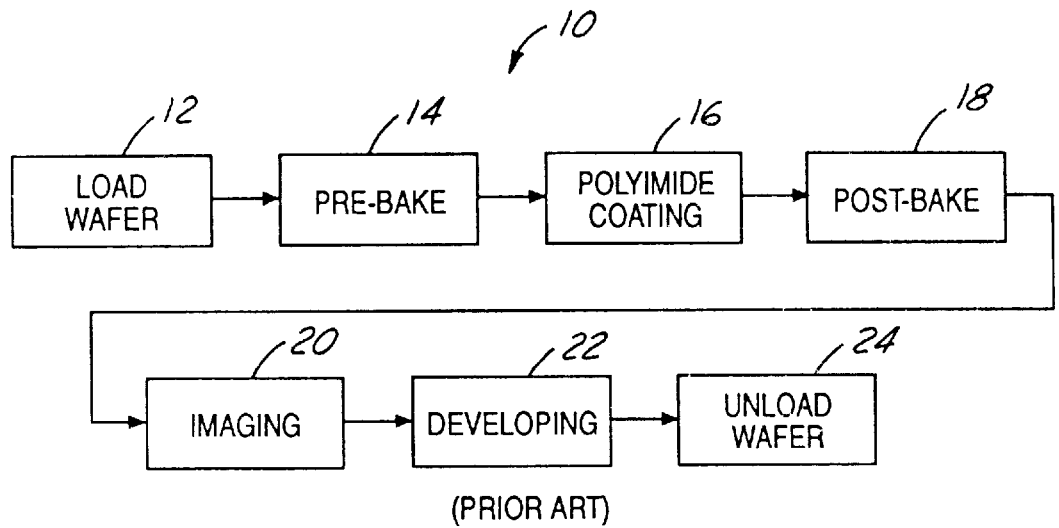
FIG. 1 is a process flow chart for a conventional polyimide deposition process.
Figure 2:
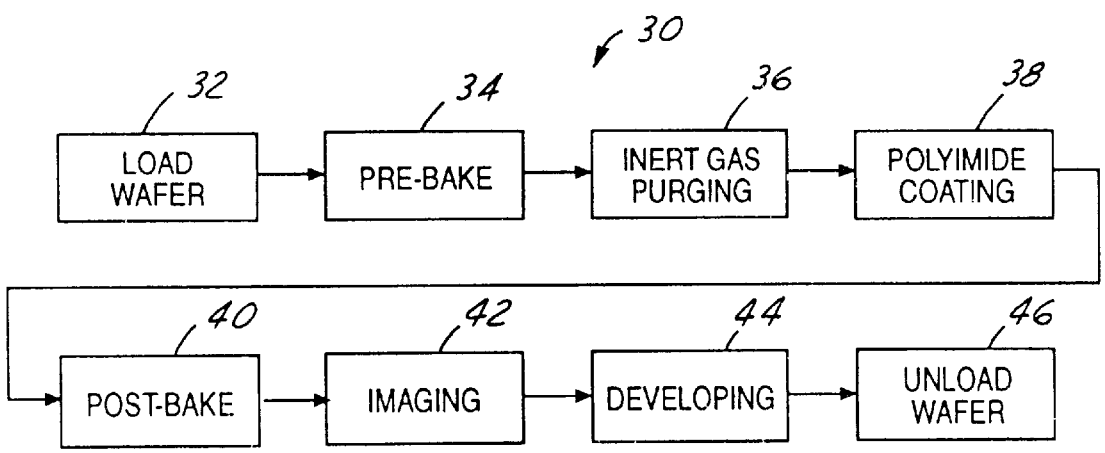
FIG. 2 is a process flow chart for the present invention polyimide deposition process incorporating an inert gas purging step.

The present invention novel method of depositing a polyimide layer on a semiconductor device without the bubble defect can be advantageously illustrated in a process flow chart of FIG. 2. It is seen that the present invention process 30 can be carried out first by a wafer loading step 32 in which a wafer is loaded into a pre-baked oven. A pre-bake process 34 can then be conducted in a bake oven wherein a temperature of 250° C. is normally set. A total pre-bake time for reducing the moisture content on the surface of the wafer is approximately 3 minutes. This pre-baking step can be carried out in several sub-steps. The wafer is then loaded into a polyimide deposition chamber and placed on a pedestal. An inert gas purging process 36 is then started with the purging of at least one inert gas selected from Ar, He or $N_2$, It should be noted that either a single inert gas or a mixture of inert gases can be utilized. A suitable flow rate of the inert gas is at least 0.5 liter/min, and preferably at least 1 liter/min.

During the inert gas purging process, the wafer temperature is also cooled to approximately room temperature. The wafer is then turned by rotating the wafer pedestal at a suitable rotating speed of between about 1,000 RPM and about 5,000 RPM. This is shown in FIG. as the polyimide coating step 38. When the wafer is rotated at a suitable rotating speed, a polyimide liquid is dispensed at or near the center of the wafer through a dispensing head such that liquid spreads out to the edge of the wafer by centrifugal forces. It should be noted that the rotating speed of the wafer, i.e., between about 1,000 RPM and about 5,000 RPM, can be suitably controlled depending on the viscosity of the coating material and the thickness of the film desired.

After the coating process 38 is carried out, the wafer is sent through a post-bake cycle 40 through a series of post-bake ovens set at gradually increasing temperatures between about 80° C. and about 95° C. For instance, a series of four post-bake ovens may be used wherein each is set at a baking temperature of 80° C., 90° C., 95° C. and 95° C.

The duration of baking in each oven may be set to approximately 1.5 min. The post-baking step 40 is carried out to evaporate the solvent contained in the polyimide liquid. After the post-bake step 40, the wafer is sent through an imaging step 42, during which a pattern is reproduced in the polyimide film on the surface of the wafer. The patterned polyimide film on the wafer surface is then developed in the developing step 44. In the last processing step, i.e., the wafer unloading step 46, the wafer is unloaded for the next step packaging process.

The polyimide liquid deposited during the coating step 38 contains a polyimide monomer, a photo-active compound, a silicon coupling agent and a solvent. A suitable photosensitive polyimide to be used in the present invention process is the negative-tone type. Openings for bond pads or fuse windows can thus be provided in the polyimide layer. It should be noted that the present invention polyimide film not only functions as a buffer coating layer for its lubricating property, but also functions as a photoresist film for its photo-sensitive nature such that features such as bond pads or fuse windows can be provided. The present invention novel polyimide deposition process can therefore carry out two major functions in a semiconductor fabrication process by a single step.

The present invention novel method is therefore amply demonstrated by the above descriptions and the appended drawing FIG. 2. The desirable effect of the present invention process can be shown in Table I.

TABLE I

| Tests | 1 | 2 | 3 |
|---|---|---|---|
| Inert Gases Flow Rate | 0 l/min | 2 l/min | 2 l/min |
| Humidity Control | 42.5% R/H | 20% R/H | 1% R/H |
| Idle Time with no Polyimide Bubble Defect Observed | 15 min | 120 min | 180 min |

It is seen that in Table 1, Test 1 indicates results obtained from a conventional process wherein no inert gas purging was utilized. The data of Test 1 is presented for comparison with the data of Test 2 and 3 obtained by the present invention method. Without the inert gas purging process, the relative humidity in the deposition chamber is measured at approximately 42.5%. An idle time that can be allowed during which no polyimide bubble defect is observed is only about 15 mins. In great contrast, Test 2 presents data that indicate when an inert gas flow at 2 l/min is used, the relative humidity in the deposition chamber is controlled at 20% which allows an idle time of 120 minutes during which no polyimide bubble defect is observed. In Test 3, where an inert gas flow rate of 2 l/min is used, and that a dryer environment having a relative humidity of 1% is achieved in the deposition chamber, an idle time of 180 minutes is allowed during which no polyimide bubble defect is observed.

It should be noted that while the deposition of a polyimide film on a semiconductor wafer is demonstrated by the preferred embodiment, the present invention novel method can be utilized in any other deposition process as long as a moisture-sensitive material is deposited on top of an electronic structure in order to avoid the formation of bubbles. For instance, any other moisture-sensitive coating material may be deposited on a wafer surface and by utilizing the present invention novel method of purging inert gas through the deposition chamber, the relative humidity in the deposition chamber can be controlled such that bubble formation does not occur. The present invention novel method therefore greatly improves the reliability of a deposition process by improving the quality of the film deposited.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for coating a polyimide precursor on an electronic structure incorporating the use of a silicon coupling agent without bubble defect comprising the steps of:

providing a deposition chamber having an electronic structure positioned therein, flowing at least one insert gas through said chamber, and while flowing of said inert gas depositing a polyimide precursor containing a silicone coupling agent on a top surface of said electronic structure in said deposition chamber.

2. A method according to claim 1, wherein said deposition chamber is hermetically sealed from its environment.

3. A method according to claim 1 further comprising the step of forming a polyimide precursor by mixing a polyimide, a silicon coupling agent, a photo-active compound and a solvent.

4. A method according to claim 1, wherein said silicon coupling agent polymerizes to produce water molecules.

5. A method according to claim 1, wherein said at least one inert gas is at least one member selected from the group consisting of Ar, He and $N_2$.

6. A method according to claim 1, wherein said at least one inert gas is flown through said deposition chamber at a flow rate of at least 0.5 liter/min.

7. A method according to claim 1, wherein said at least one inert gas is a member selected from the group consisting of Ar, He and $N_2$.

8. A method according to claim I further comprising the step of forming a polyimide film which functions both as a photoresist layer and as a buffer layer.

9. A method according to claim 1, wherein said polyimide precursor contains a photo-sensitive polyimide.

10. A method for forming a photo-sensitive polyimide film on a semiconductor wafer comprising the steps of positioning a semiconductor wafer in a deposition chamber, flowing at least one inert gas through said chamber at a flow rate sufficient to maintain a relative humidity in said chamber at less than about 25%, and while flowing of said inert gas depositing a photo-sensitive polyimide precursor containing a moisture-sensitive coupling agent on a top surface of said semiconductor wafer in said deposition chamber.

11. A method according to claim 10, wherein said moisture-sensitive coupling agent is a silicon-based coupling agent.

12. A method according to claim 10, wherein said at least one inert gas is selected from the group consisting of Ar, He and $N_2$.

13. A method according to claim 10, wherein said flow rate of said at least one inert gas is larger than 0.5 l/min.

14. A method according to claim 10 further comprising the step of mixing said photo-sensitive polyimide precursor with a polyimide, a silicon coupling agent, a photo-active compound and a solvent.

* * * * *